(12) United States Patent
Liu

(10) Patent No.: US 6,211,682 B1
(45) Date of Patent: Apr. 3, 2001

(54) METHOD AND CIRCUITRY FOR MEASURING LOOP RESISTANCE

(75) Inventor: Liqing Liu, Calgary (CA)

(73) Assignee: Prime Perforating Systems Limited, Calgary (CA)

( * ) Notice: Subject to any disclaimer, the term of this patent is extended or adjusted under 35 U.S.C. 154(b) by 0 days.

(21) Appl. No.: 09/140,061

(22) Filed: Aug. 24, 1998

(51) Int. Cl.$^7$ ............................................. G01R 31/00
(52) U.S. Cl. ................................................... 324/502
(58) Field of Search .................................... 324/502, 549, 324/618, 654, 523, 525, 527; 102/206

(56) References Cited

U.S. PATENT DOCUMENTS

| | | | |
|---|---|---|---|
| 3,762,331 | 10/1973 | Vlahos | 102/70.2 R |
| 4,273,051 | 6/1981 | Stratton | 102/202.11 |
| 4,482,858 | 11/1984 | Plichta | 324/57 |
| 4,649,821 | 3/1987 | Marshall et al. | 102/206 |

*Primary Examiner*—Safet Metjahic
(74) *Attorney, Agent, or Firm*—Blake, Cassels & Graydon LLP

(57) ABSTRACT

This invention provides a method and electronic circuits for the testing of new initiation devices that use a small transformer whose heating element resistance can not be measured using traditional methods and instruments. A small current testing signal is applied to the primary winding of the detonator through its leg wires that are connected in a certain circuit configuration. The resistance of the secondary winding connected with the bridge wire is then reflected to the primary side and its effects are then observed. By calibrating the relationship of such effects with the value of loop resistance, the loop resistance can he displayed. Since the testing signal is very small in nature for safety considerations, the sampled effects (generally the voltage wave) are amplified. The amplified effects are displayed with analogue or digital meters or other display means.

24 Claims, 4 Drawing Sheets

METHOD AND CIRCUITRY FOR MEASURING LOOP RESISTANCE

FIELD OF THE INVENTION

The present invention relates generally to a method and electronic circuitry for measuring the electric resistance of the heating element in a transformer coupled initiator. In a particular example it can be used for measuring the loop resistance, including the bridge wire, in a transformer based electric detonator.

BACKGROUND OF THE INVENTION

The heating element, such as a bridge wire, of a conventional electric detonator is typically connected directly to the leg wires of the detonator. Its resistance can he measured by connecting the leg wires to a resistance meter (normally called a blasting ohmmeter) which uses much smaller electric currents than normal ohmmeters in the measuring process for safety reasons. However, in a transformer-based detonator, the bridge wire of the detonator is electrically isolated from the detonator's leg wires. Most often, the small transformer is encapsulated within the header of a detonator, leaving no direct electric access to the bridge wire. Therefore, it is not possible to measure the resistance of the bridge wire directly. That is, the resistance of the closed loop formed by the secondary winding and the bridge wire is isolated from DC in the primary. In use, the initiation energy is transformed from the primary winding to the secondary winding of the transformer via the magnetic linking between the two windings. Therefore, the resistance of the loop formed by the secondary winding and the bridge wire is designed to be in a certain range to receive the right amount of initiation energy so that the detonator can function reliably. If the loop resistance is too low, or too high, such as in the extreme cases of a short circuit or an open circuit, the detonator will fail to initiate. To make sure that the detonator receives the right amount of initiation energy, the bridge wire resistance is often designed to have a certain value with some tolerance. The measured loop resistance is the sum of the bridge wire resistance and the resistance of secondary winding. Since the resistance of the secondary winding is known and is determined by the design of the small transformer, the actual bridge wire resistance is obtained by subtracting the winding resistance from the loop resistance.

This apparatus described, and its use concern the method and circuitry for measuring the resistance of a closed loop, without touching the loop. In particular it can be used for checking the resistance of an initiation device which includes the use of two isolated windings. Examples of this kind of detonator are shown in U.S. Pat. No. 3,762,331 to Vlahos and U.S. Pat. No. 4,273,051 to Stratton. My co-pending U.S. patent application No. 08/992412 (assigned to Prime Perforating Systems) discloses the use of an isolated loop detonator in which a combination of different magnetic materials are used, enabling the detonator only to respond to a pre-determined frequency band. FIG. 1 is an illustration of such a detonator indicated generally as 20. A heating element, in the nature of a bridge wire 22 of detonator 20 has a resistance Rx. It forms a closed loop 24 with secondary winding 26. For safety considerations, loop 24 is electrically isolated from the primary winding, indicated as 30. The two windings 26 and 30, are magnetically coupled by a magnetic material 32 for the transmission of a firing signal having pre-determined characteristics, from leg wires 34. Since primary winding 30 is isolated from the bridge wire 22, it is not possible to measure the resistance of bridge wire 22 using a traditional blasting ohmmeter as is practised with conventional electrical detonators. However, the manufacturing process of the detonator requires that bridge wire 22 have a resistance as designed. Too great or too small a resistance may result in a detonator that does not explode as desired. Thus the measuring and monitoring of the actual bridge wire resistance is an important means of quality control. Also, a detonator is checked to assure that it is in good condition before it is used. There is a need for an instrument for measuring the resistance of such detonators. This instrument must not transmit a high energy test signal into the detonator, lest it explode. It must rely on a small signal and amplification.

U.S. Pat. No. 4,482,858 to Plichta discloses a method of testing a kind of electric detonator that has a ferrite core. The method is to use a small capacitor to store a calibrated amount of energy. This energy is discharged to a lead wire which forms the primary winding of the detonator. The value of the capacitor is calculated to ensure that the resulting RLC circuit, with the detonator to be tested, will be overdamped. Then the peak voltage over the primary lead wire is amplified and displayed. As the Plichta claims state, Plichta has "measurement means for effecting a single reading of a single peak value." It measures a peak value of a discrete pulse, then permits a relatively long time period to elapse. During this time period the pulse decays. After the first test pulse has died, a second test pulse is generated.

Since the parameters of the apparatus are determined by the inductance, and the resistance of the bridge wire, and since the apparatus is calibrated by the module of the detonator to be tested, it may tend to be suitable only for testing the detonator for which it is built. It would be advantageous to make a testing meter whose parameters are independent of the detonator to be tested, therefore, it should be flexible to test different designs of transformer-based detonators with minimal adjustments or calibrations.

U.S. Pat. No. 4,649,821 to Marshall describes an electrical circuit continuity test apparatus for testing high-energy-discharge circuitry of a firing unit. It includes the use of a transformer structure to sense the capacitance change in the secondary winding.

SUMMARY OF THE INVENTION

In one aspect of the present invention there is a method and circuitry for measuring the resistance of a transformer-based detonator. A wave train is generated and applied to a voltage sampling circuit that is configured to obtain the effects of loop resistance change in the secondary winding of the detonator transformer. The signal applied to the sampling circuit is attenuated so that the thermal effects in the detonator are negligible and the measuring process is relatively safe. The sampled voltage is then amplified, rectified and displayed. The loop resistance of the detonator can be read by calibrating the relationship between the loop resistance and amplified voltage. The voltage can be displayed using analogue or digital volt or galvanometers or logical circuits.

In another aspect of the present invention there is an apparatus for measuring the loop resistance of a transformer based detonation initiation device, the apparatus comprising a two terminal port for connection to a time varying test signal source. A test port is intermediate the terminals of the two terminal port, for connection to the leads of the transformer based detonation device, to form a circuit path between the two terminals. There is an output signal sensor connected to permit determination of steady state signals in the path, whereby the loop resistance can be deduced from the steady state signals sensed at the output sensor.

In an additional feature of that aspect of the invention the apparatus comprises a sampling element in series with the test port. The output signal sensor is connected to sense voltage at the sampling element. In another additional feature of that aspect of the invention the sampling element is a sampling transformer for obtaining a sample voltage isolated from the signal source. The sampling transformer has one winding connected in series with the test port and another winding whence the output signal sensor senses voltage. In an additional feature of that additional feature, there is a charge storage element connected in parallel to the test port and the sampling transformer. In another additional feature of that aspect of the invention, the apparatus includes a current limiter for limiting the current that can flow through the detonation device being tested. In a further additional feature of that additional feature, the current limiter is a resistor. In yet another additional feature of that aspect of the invention, the apparatus is designed for operation at frequencies preferably of at least 1 kHz.

In still another aspect of the present invention there is an apparatus for measuring the loop resistance of a transformer based detonation initiation device, the apparatus comprising a signal generator capable of generating a test signal wave train. There is a sampling circuit connected to receive the test signal wave train from the signal generator. The sampling circuit has a test port for receiving the transformer based detonation device in electrical connection therewith. The apparatus has a tap whence the properties of the signal in the sampling circuit can be determined and a signal processor for processing the signal sensed at the tap to yield an indication of said loop resistance.

In an additional feature of that aspect of the invention the signal generator has a test signal stabilizer. In another additional feature of that aspect of the invention the test signal stabilizer includes a voltage regulator. In still another additional feature of that aspect of the invention the test signal stabilizer includes a signal generator such as a timer. In yet another additional feature of that aspect of the invention the apparatus has a design frequency that is preferably at least 1 kHz. In a further additional feature of that aspect of the invention the apparatus includes a current limiter for limiting current flow in the sampling circuit when a transformer based detonation device is being tested. In a further still additional feature of that aspect of the invention the apparatus further comprises an under-voltage warning circuit.

In an additional feature of that aspect of the invention the sampling circuit includes a sampling transformer having a primary winding in series with the test port, and the tap is operatively connected to a secondary winding of the sampling transformer. In again another additional feature of that aspect of the invention the signal processor includes an amplifier responsive to the signal sensed at the tap. In a still further additional feature of that aspect of the invention the apparatus has a display having a first state indicating too low a loop resistance, a second state indicating too high a loop resistance, and a third state indicating loop resistance within specification.

In a further aspect of the present invention there is a method of determining the loop resistance of a transformer based detonation initiation device. The method comprises establishing the transformer based detonation transfer device to be tested in connection with a test port of a sampling circuit of a testing apparatus, exposing the sampling circuit, and the device to be tested, to a known wave train, sensing the steady state signal flowing in the sampling circuit, and determining from the sensed signal whether the loop resistance is within a specified range.

In an additional feature of that method aspect of the invention, the step of sensing includes monitoring a secondary winding of a sampling transformer whose primary winding is connected in series with the test port. In another additional feature of that aspect of the invention the method further comprises the step of generating the wave train, having a timed signal at a frequency preferably of at least 1 kHz. In a further additional feature of that aspect of the invention the step of generating the wave train includes providing a DC voltage to a voltage regulator, providing a low voltage warning circuit for warning of low voltage, and inverting a DC voltage output from the voltage regulator to yield the wave train. In yet another additional feature of that aspect of the invention the method includes providing a current limiter to limit current flow in the sampling circuit. In still another additional feature of that aspect of the invention the step of sensing is followed by the steps of amplifying the sensed signal and rectifying the amplified signal. In a yet further additional feature of that aspect of the invention the step of determining includes comparing the rectified signal with a high reference and with a low reference, and displaying a too high indication when the loop resistance is too high, displaying a too low indication when the loop resistance is too low, and displaying an acceptable indication when the loop resistance is within specification.

BRIEF DESCRIPTION OF THE DRAWINGS

Many of the advantages of the present invention will be apparent as the invention becomes better understood by reference to the following detailed description with the accompanying drawings, wherein.

DESCRIPTION OF THE PREFERRED EMBODIMENT

Figure 1:
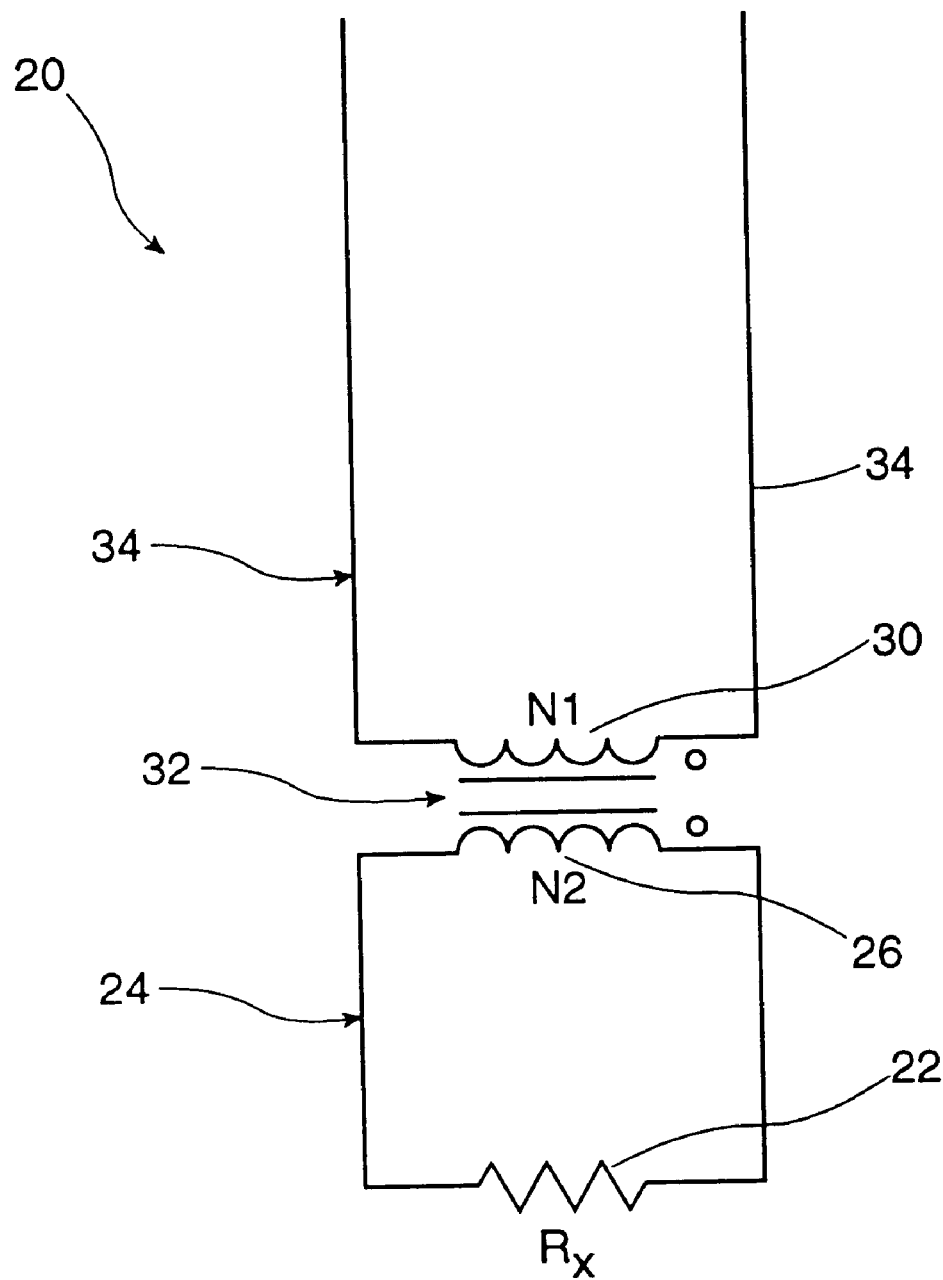
FIG. 1 is an illustration of the structure of a transformer-based detonator, having an unknown resistance to be measured.

As shown in FIG. 1, loop 24 containing bridge wire 22 with resistance Rx, is electrically isolated from, but magnetically coupled with, the primary winding 30. Only alternating signals (AC signals or DC Pulses) can reach the loop 24 to be measured. When a signal is applied to primary winding 30 through leg wires 34, the resistance of the loop to be measured, loop 24, is reflected to the primary side, yielding some electrical effects. The signal applied to detonator 20 must be sufficiently small that heat generated by bridge wire 22 is negligible to avoid safety problems during the measuring process of detonator 20. The obtained effects are then simplified and displayed.

Figure 2:
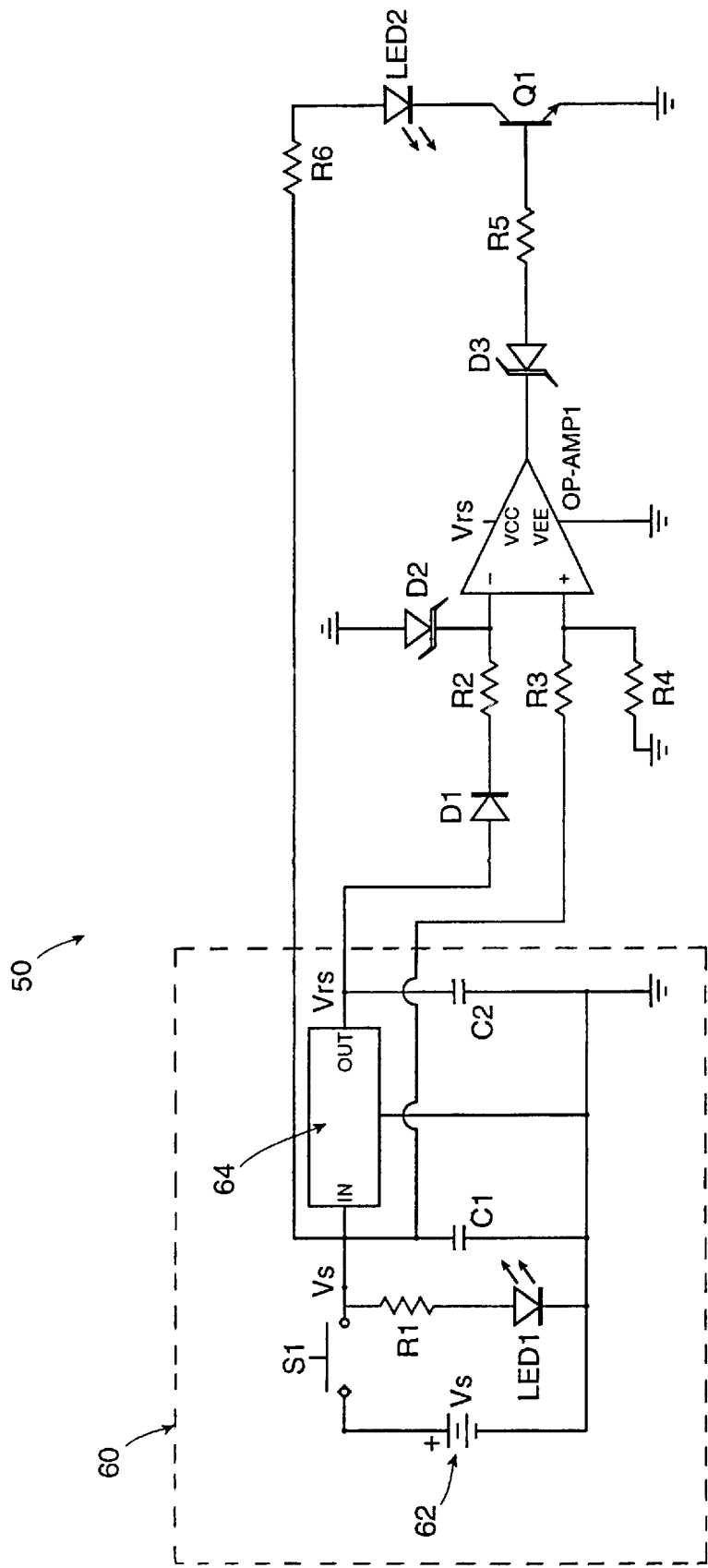
FIG. 2 shows a an example of a first, power supply, portion of an example embodiment of a circuit for measuring the unknown resistance of FIG. 1 according to the principles of the present invention.

A resistance measuring apparatus is indicated generally as 50. Part of this apparatus is shown in each of FIGS. 2, 3 and 4. In FIG. 2, a power supply for the preferred embodiment is indicated generally as 60. The source voltage Vs can be obtained with a 9V instrument battery 62. S1 is a power switch of the circuitry. When the power is switched on, LED1 comes on and R1 is connected in series with LED1 to limit the current running through LED1. If the current rating of LED1 is 2 mA, R1 should be 4–5 Kohms. A voltage regulator 64 is used so that when the voltage of battery 62 drops, the voltage output of power supply 60 to the other circuitry, to be described, still remains at a predetermined value. In the embodiment, voltage regulator 64 is a 78L05, the capacitors C1 and C2 are 1 micro Farad each. Voltage regulator 64 can stabilize the output voltage Vrs only if the source voltage Vs is in a certain level. When Vs drops below that level, the output of the regulator Vrs will drop too, and will consequently influence the measuring accuracy of apparatus 50. The circuitry on the right side of 60, is designed to monitor the voltage change. Diode D1, resistor R2 and zener diode D2 sample the voltage from the output end of voltage regulator 64; resistors R3 and R4 sample the voltage Vs from battery 62. The operational amplifier OP-AMP1 functions as a voltage comparator. When source voltage Vs drops below a predetermined level, OP-AMP1 outputs a current through zener diode D3, and resistor R5 to the base of transistor Q1. Then the transistor conducts, and current runs through R6 and LED2. LED2 comes on, giving a low battery voltage warning to remind the operator to change battery 62. In the example illustrated, D1 is 1N4148, D2 and D3 are 2.4 V zener diodes. R2 and R3 are 10 Kohms and 70 Kohms, respectively, R4 is a 100 Kohm potentiamer. R5 and R6 are 2 Kohms each. The transistor Q1 is 2N2222.

An alternating or DC pulse signal is needed for the measuring process. This signal can be a sinusoidal, triangular or square wave and can be generated by a number of alternative circuits. In the embodiment of the illustrative example shown in FIG. 3, a signal generator is indicated generally as 70. It uses a 555 timer 72, drawing power at Vrs to generate a square wave. Resistors R6x and R7 are 1 Kohm and 35 Kohm, respectively, capacitors C3 and C5 are 1 micro Farad each. The output square wave is coupled by the capacitor C4 (4.7 micro Farad in the embodiment) to a voltage sampling circuit indicated generally as 80. The output signal frequency of signal generator 70 is approximately 2 kHz.

Figure 3:
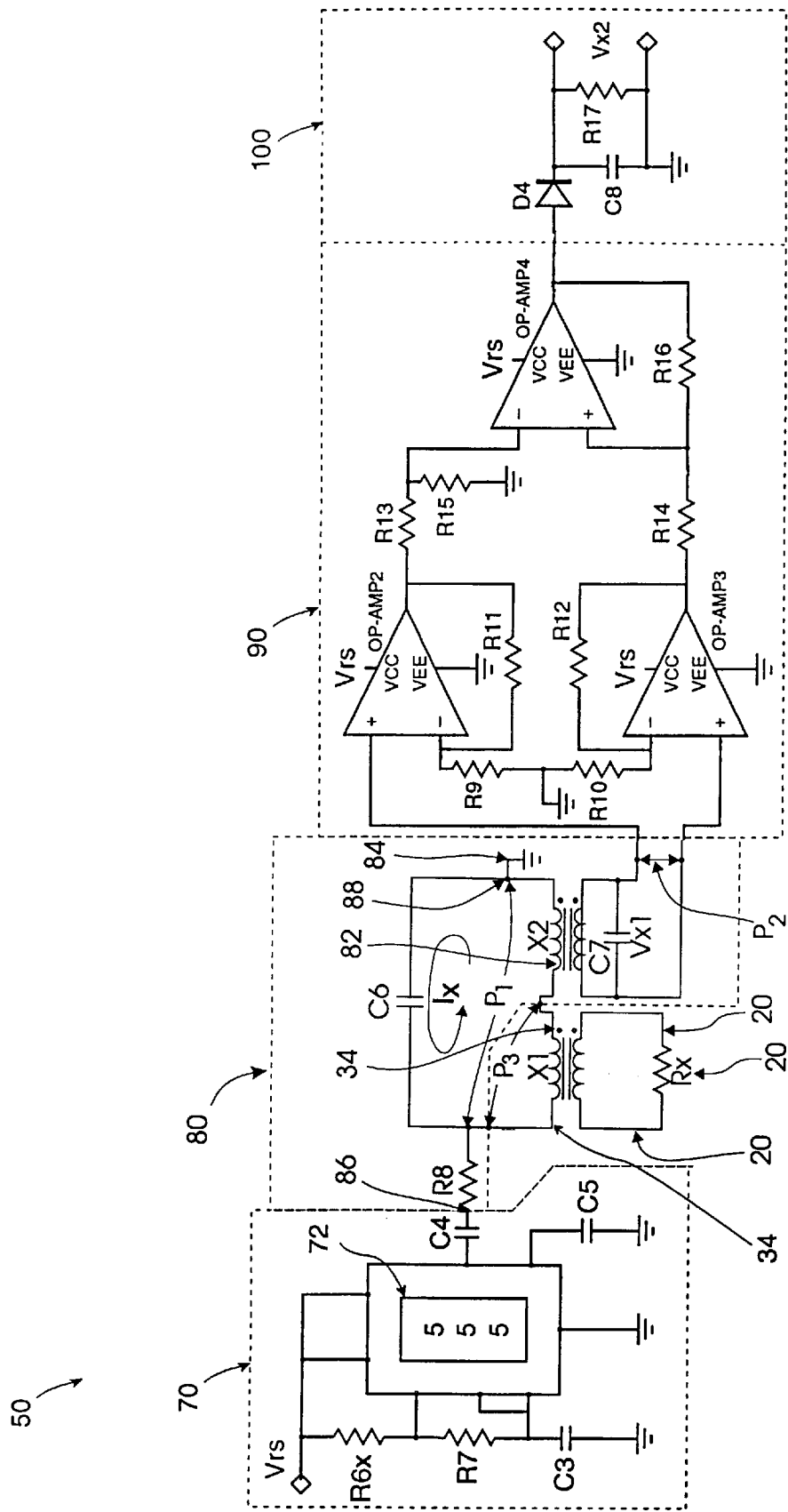
FIG. 3 shows an example of a second, sampling and amplifying, portion of the example embodiment of a circuit for measuring the unknown resistance of FIG. 1, for connection to the first, power supply portion of FIG. 2.

As shown in FIG. 3, voltage sampling circuit 80 has a pair of transformers X1 and X2. Transformer X1 is the small transformer of detonator 20. Rx is, as noted above, the resistance of bridge wire 22 in loop 24 whose measurement is sought. Leg wires 34 of Transformer X1 are connected into sampling circuit 80 at a test port P3, thus placing primary winding 30 in series with primary winding 82 of Transformer X2 between resistor R8 and a ground, 84. Resistor R8 is connected to capacitor C4 of signal generator 70, the connection defining a first terminal 86 of sampling circuit 80. A further capacitor C6 is connected in parallel with primary windings 30 and 82 between R8 and ground 84. The connection with ground 84 defines a second terminal 88 of sampling circuit 80. Terminals 86 and 88 define a first two-terminal port, P1, for connection to a time varying source, namely the output square wave at capacitor C4, noted above, relative to ground 84.

Transformer X2 is mounted on a circuit board with resistor R8, and capacitor C6. It is comparable in size with Transformer X1. The Transformer X2 is used to isolate the sampled voltage, Vx1, over capacitor C7 from the signal source. The voltage Vx1 is obtained as stated below.

Transformer X1 has primary and secondary windings of N1 and N2 turns respectively. When a signal is applied to X1, the loop resistance Rx is reflected to the primary side according to the following relationship:

$$R_{APPARENT} = (N1/N2)^2 Rx$$

For example, if the winding ratio N1/N2 is 2 and the loop resistance is 1 ohm, the apparent resistance seen from the primary side of the detonator is 4 ohms. When a constant wave train signal from signal generator 70 is applied, the electric current Ix running in the circle formed by X1, X2 and C6 is a function of the loop resistance Rx. The voltage Vx1 across the small capacitor C7 connected to the secondary winding of X2 is in turn a function of Ix. The effects of Rx are measured by observing the voltage changes of Vx1 at an output port P2. In the stated sampling circuit, Vx1 changes inversely with Rx, That is, when Rx is short circuited, Vx1 has the maximum value, and if RX is infinite, as in the case of an open circuit, Vx1 has the minimum value. Resistor R8 is used to limit the maximum possible electric current that may run through detonator 20. R8 is chosen so that the signal is strong enough for sampling but the thermal effects generated by the current running through Rx are not large. In the embodiment described, R8 has a value of 500 ohms, dictating that the maximum current running in the circle of X1, X2 and C6 is about SmA (assuming that the duty cycle of the signal to be 0.5). Capacitors C6 and C7 are 4.7 micro Farad each. The detonator transformer X1 has a ratio of 50:25 and the winding ratio for X2 if 10:5 (the core of X2 may be a Mn-Zn ferrite core having an outer diameter of about 10 mm). Since the heat generated by the current is proportional to the square of the current, therefore, the smaller the signal current, the safer the measuring process. Given that in blasting ohmmeters the testing current used is generally in the order of 50 mA, the preferred embodiment illustrated may well provide improved safety for the measuring process. Smaller signal currents (for example, less than 1 mA) are possible by increasing the value of R8. When lower testing current amperage is used, the sampled voltage will also be low, this can be compensated for by increasing the gain of the amplifiers so that the same magnitude of voltage can be displayed. Due to the small signal used, the magnitude of the sampled voltage Vx1 is normally in the order of 20–80 mV. It is amplified so that it can be displayed and observed more easily. An amplifier, in the form of amplifying circuit 90 of FIG. 3 shows circuitry for amplifying Vx1. Two operational amplifiers, OP-AMP2 and OP-AMP3, form a differential amplifier. The signal is further amplified by OP-AMP4. In the embodiment illustrated, a single supply is used for the operational amplifiers and they are not biased. Therefore, the signal is half-wave amplified. In the embodiment illustrated, resistors R9 and R10 are equal and have resistance of 10 Kohms. R11 and R12 are 50 Kohms each; R13 and R14 are 20 Kohms each and R16 is 220 Kohms. R15 is typically 10 Mohms. The amplified signal from the output of OP-AMP4 is half-wave signal. The value of the resistors from R9 to R16 are chosen so that where Rx=0, and Vx1 has its maximum amplitude, the output from OP-AMP4 is close to saturation.

The half-wave signal from OP-AMP4 is now easily detectable. For the convenience of display, it can be rectified. A circuit is shown generally as 100 in FIG. 3. The amplified signal from amplifying circuit 90 signal being rectified by diode D4, to give a stable DC voltage Vx2 over the capacitor C8. In the example shown D4 is 1N4148 diode, CS is 0.47 micro Farad and R17 is a bleeder resistor for CS having a value of 10 mega-ohms. Now Vx2 is ready for display. Analog or digital volt meters or galvanometers can be used to display the value of Vx2 that corresponds to the Rx values.

Figure 4:
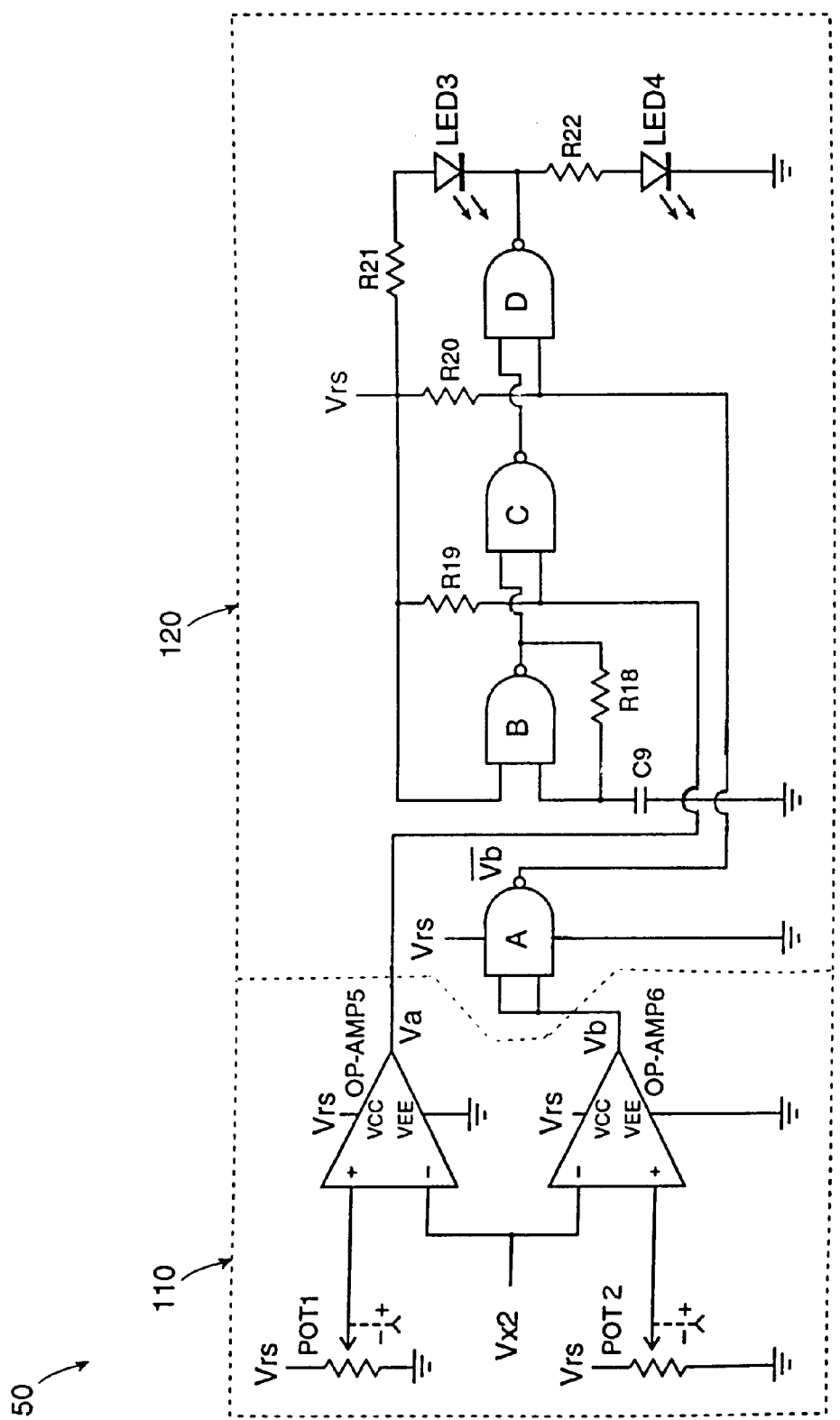
FIG. 4 shows an example of a third, output, portion of the example embodiment of a circuit for measuring the unknown resistance of FIG. 1, for connection to the second, sampling and amplifying, portion of FIG. 3.

Once a detonator has been designed, the bridge wire resistance should take a certain value with a given tolerance. For a transformer-based detonator, if the loop resistance falls within a given value, it will be accepted. Otherwise, it will be rejected as an off-specification product, whether the resistance is lower or higher. Also, it may be of interest to know the reason why the detonator is off-specification. For example, if a batch of detonators tested all tend to have a too low, or too high, resistance, there may be a problem with the manufacturing process and equipment, that should be corrected. Therefore, the range within which the loop resistance falls, instead of the actual value of the resistance, may be of more concern. The display circuits indicated generally as 110 and 120 of FIG. 4 are designed to address this concern.

Circuits 110 and 120 form a three-state display circuit. In circuit 110, two operational amplifiers OP-AMP5 and OP-AMP6 are used to form a double-limit voltage comparator. The upper limit of voltage $V_H$ for comparison is obtained by adjusting the potentiometer POT1. $V_H$ should correspond to the minimum loop resistance that is acceptable. Similarly, the lower limit of voltage $V_L$ for comparison is obtained by adjusting potentiometer POT2 and $V_L$ corresponds to the maximum acceptable loop resistance. The voltage to be displayed Vx2 is connected to the inverting input terminals of the two operating amplifiers, as shown.

The outputs Va from OP-AMP5 and Vb from OP-AMP6 are determined by the actual value of Vx2 compared to $V_H$ and $V_L$. In circuit 120 of FIG. 4, the four CMOS NAND gates are used for logical operations of the results before they are displayed.

GateA reverts Vb to give an output $\overline{Vb}$. C9 and R18 form an oscillation circuit with Gate B. The circuit is so designed that when the resistance measured in loop 24 is smaller than the lower limit, LED3 comes on but LED4 does not. When the resistance in loop 24 is higher than the high limit, LED4 comes on but LED3 does not. When the resistance is in the right range ($RL \leq Rx \leq RH$), LED3 and LED4 will turn on and off alternatively. Table 1 is the logical truth table of the three-state display circuit. In the embodiment shown, C9 is 1 micro Farad. R18 is 560 Kohms, giving an oscillating frequency of approximately of 2 Hz. R19 and R20 are 1 mega-ohms each. R21 and R22 are 1.5 Kohms each.

TABLE 1

Logical truth table of the three-state display circuit

| RX value | Vx2 value | Va | Vb | $\overline{Vb}$ | LED3 | LED4 |
|---|---|---|---|---|---|---|
| RX < RL | VX2 > VH | 0 | 0 | 1 | 1 | 0 |
| RL <= RX <= VH | VL <= VX2 <= VH | 1 | 0 | 1 | 1* | 1* |
| RX > VH | VX < VL | 1 | 1 | 0 | 0 | 1 |

*In this state, LED3 and LED4 come on alternatively at a frequency determined by C9 and R18.

In the method and circuitry illustrated, the parameters of the testing circuitry are independent of the detonator to be tested. For a certain design of the detonator, the inductance, as well as the winding and bridge wire resistance each fall in a given range. A testing instrument made according to the circuitry illustrated is adaptable to change in the parameters of the detonator to be tested. The testing apparatus can be adapted to test a detonator of a different design (new designs of a transformer-based detonator may vary in primary and secondary winding turns, the material of the transformer core as well as the size of the core, actual bridge wire resistance, and so on) by changing the calibration of the instrument using the new design of the detonator. In the case of a three-state display as described the apparatus can be adapted for testing a different type of detonator by changing the values of lower and upper limits $V_L$ and $V_H$ for the double-limit voltage comparator.

The preferred embodiment described above has been provided to elucidate the method and circuitry of the present invention. Modifications are possible without departing from the spirit and scope of the principles of the present invention. For example, a dual power supply can be used in place of a single supply. Varied signal generators may be used and varied sampling circuits and display means are also possible as mentioned early in the text. The principles of the invention are not limited by this embodiment but only by the claims appended hereto.

I claim:

1. An apparatus for measuring loop resistance of a transformer based detonation initiation device, said apparatus comprising:

a first two terminal, port for connection to a time varying test signal source;

a test port, intermediate the terminals of said first port, for connection to the leads of the transformer based detonation device to form a circuit path between said two terminals of said first port;

an output signal sensor connected to permit determination of steady state signals in said path;

whereby the loop resistance can be deduced from the steady state signals sensed at said output sensor.

2. The apparatus of claim 1 wherein said apparatus comprises a sampling element in series with said test port and said output signal sensor is connected to sense voltage at said sampling element.

3. The apparatus of claim 2 wherein said sampling element is a sampling transformer for obtaining a sample voltage isolated from the signal source, said sampling transformer having one winding connected in series with said test port and another winding whence said output signal sensor senses voltage.

4. The apparatus of claim 3 wherein a charge storage element is connected parallel to said test port and said sampling transformer.

5. The apparatus of claim 2 wherein said apparatus includes a current limiter for limiting the current that can flow through the detonation device being tested.

6. The apparatus of claim 5 wherein said current limiter is a resistor.

7. The apparatus of claim 1 wherein said apparatus is designed for operation at frequencies of at least 1 kHz.

8. An apparatus for measuring the loop resistance of a transformer based detonation initiation device said apparatus comprising:

a signal generator capable of generating a test signal wave train;

a sampling circuit connected to receive the test signal wave train from said signal generator;

said sampling circuit having a test port for receiving the transformer based detonation device in electrical connection therewith;

said apparatus having a tap whence the properties of the signal in said sampling circuit can be determined; and a signal processor for processing the signal sensed at said tap to yield an indication of said loop resistance.

9. The apparatus of claim 8 wherein said signal generator has a test signal stabilizer.

10. The apparatus of claim 9 wherein said test signal stabilizer includes a voltage regulator.

11. The apparatus of claim 9 wherein said test signal stabilizer includes a timer.

12. The apparatus of claim 8 wherein said apparatus has a design frequency that is at least 1 kHz.

13. The apparatus of claim 8 wherein said apparatus includes a current limiter for limiting current flow in said sampling circuit when a transformer based detonation device is being tested.

14. The apparatus of claim 8 wherein said apparatus further comprises an under-voltage warning circuit.

15. The apparatus of claim 8 wherein said sampling circuit includes a sampling transformer having a primary winding in series with said test port, and said tap is operatively connected to a secondary winding of said sampling transformer.

16. The apparatus of claim 8 wherein said signal processor includes an amplifier responsive to the signal sensed at said tap.

17. The apparatus of claim 8 wherein said apparatus has a display having a first state indicating too low a loop resistance, a second state indicting too high a loop resistance, and a third state indicting loop resistance within specification.

18. A method of determining the loop resistance of a transformer based detonation initiation device, said method comprising:

establishing the transformer based detonation transfer device to be tested in connection with a test port of a sampling circuit of a testing apparatus;

exposing said sampling circuit, and said device to be tested, to a known wave train;

sensing the steady state signal flowing in said sampling circuit; and determining from the sensed signal whether the loop resistance is within a specified range.

19. The method of claim 18 wherein said step of sensing includes monitoring a secondary winding of a sampling transformer whose primary winding is connected in series with said test port.

20. The method of claim 18 wherein said method includes the step of generating the wave train, and the step of generating the wave train includes producing a timed signal at a frequency of at least 1 kHz.

21. The method of claim 20 wherein said step of generating said wave train includes:

providing a DC voltage to a voltage regulator;

providing a low voltage warning circuit for warning of low voltage; and inverting a DC voltage output from said voltage regulator to yield said wave train.

22. The method of claim 18 wherein said method includes providing a current limiter to limit current flow in said sampling circuit.

23. The method of claim 18 wherein said step of sensing is followed by the steps of an amplifying said sensed signal and rectifying said amplified signal.

24. The method of claim 23 wherein said step of determining includes:

comparing said rectified signal with a high reference and a low reference; and displaying a too high indication when the loop resistance is too high;

displaying a too low indication when the loop resistance is too low; and displaying an acceptable indication when the loop resistance is within specification.

* * * * *